United States Patent
Schuster et al.

(10) Patent No.: US 10,503,075 B2
(45) Date of Patent: Dec. 10, 2019

(54) EUV COLLECTOR

(71) Applicant: Carl Zeiss SMT GmbH, Oberkochen (DE)

(72) Inventors: Ingrid Schuster, Oberkochen (DE); Wolfgang Merkel, Neu-Ulm (DE); Georgo Metalidis, Koenigsbronn-Zang (DE); Holger Kierey, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/199,946

(22) Filed: Nov. 26, 2018

(65) Prior Publication Data

US 2019/0094699 A1  Mar. 28, 2019

Related U.S. Application Data

(63) Continuation of application No. PCT/EP2017/062639, filed on May 24, 2017.

(30) Foreign Application Priority Data

May 31, 2016  (DE) .................. 10 2016 209 359

(51) Int. Cl.
*G03F 7/20* (2006.01)
*G02B 5/08* (2006.01)
(Continued)

(52) U.S. Cl.
CPC .......... *G03F 7/702* (2013.01); *G02B 5/0833* (2013.01); *G02B 5/0891* (2013.01); *G02B 5/09* (2013.01);
(Continued)

(58) Field of Classification Search
CPC .. G03F 7/70175; G03F 7/70033; G03F 7/702; G02B 19/0095; G02B 5/0891;
(Continued)

(56) References Cited

U.S. PATENT DOCUMENTS

2005/0197242 A1* 9/2005 Mitra .................. C03C 10/0027
501/7
2013/0301151 A1* 11/2013 Ekstein ................ G02B 5/0891
359/838

FOREIGN PATENT DOCUMENTS

DE  10 2009 045 096 A1  10/2010
DE  10 2009 044 462 A1   1/2011
(Continued)

OTHER PUBLICATIONS

John C. Stover, "Optical Scattering: Measurement and Analysis", SPIE, 2nd edition (1995) (in particular, formula (3.46)).
(Continued)

*Primary Examiner* — Steven Whitesell Gordon
(74) *Attorney, Agent, or Firm* — Fish & Richardson P.C.

(57) ABSTRACT

An EUV collector for use in an EUV projection exposure apparatus includes at least one mirror surface having surface structures for scattering a used EUV wavelength ($\lambda$) of used EUV light. The mirror surface has a surface height with a spatial wavelength distribution between a lower limit spatial wavelength and an upper limit spatial wavelength. An effective roughness (rmsG) below the lower limit spatial wavelength (PG) satisfies the following relation: $(4\pi \text{ rmsG} \cos(\theta)/\lambda)^2 < 0.1$. $\theta$ denotes an angle of incidence of the used EUV light at the mirror surface. The following applies to an effective roughness (rmsGG') between the lower limit spatial wavelength (PG) and the upper limit spatial wavelength (PG'): 1.5 rmsG<rmsGG'<6 rmsG.

20 Claims, 7 Drawing Sheets

(51) Int. Cl.
  *G21K 1/06* (2006.01)
  *G02B 5/09* (2006.01)
  *G02B 19/00* (2006.01)
  *G02B 5/18* (2006.01)

(52) U.S. Cl.
  CPC ......... *G02B 5/1838* (2013.01); *G02B 5/1861* (2013.01); *G02B 19/0047* (2013.01); *G02B 19/0095* (2013.01); *G03F 7/70033* (2013.01); *G03F 7/70175* (2013.01); *G03F 7/70316* (2013.01); *G21K 1/062* (2013.01); *G21K 2201/064* (2013.01); *G21K 2201/067* (2013.01)

(58) Field of Classification Search
  CPC ............. G21K 1/062; G21K 2201/067; G21K 2201/064; G21K 2201/061
  See application file for complete search history.

(56) References Cited

FOREIGN PATENT DOCUMENTS

| | | |
|---|---|---|
| DE | 10 2010 030 913 A1 | 10/2011 |
| DE | 10 2012 202 675 A1 | 1/2013 |
| DE | 10 2012 209 882 A1 | 6/2013 |
| DE | 10 2013 002 064 A1 | 8/2013 |
| EP | 1 796 147 A1 | 6/2007 |
| WO | WO 2009/024164 A | 2/2009 |
| WO | WO 2013/174644 A1 | 11/2013 |

OTHER PUBLICATIONS

Duparré et al., "Surface characterization techniques for determining the root-mean-square roughness and power spectral densities of optical components", Applied Optics, vol. 41, No. 1, Jan. 1, 2002.
Bozec et al., "Cooled EUV collector optics for LLP and DPP sources", Extreme Ultraviolet (EUV) Lithography II, SPIE, Mar. 17, 2011, pp. 1-10.
Girard, Luc et al., "Fabrication of EUVL micro-field exposure tools with 0.5 NA", Optomechatronic Micro/Nano Devices and Components III, SPIE, Oct. 11, 2015, pp. 96330V-96330V, XP060062765.
German Examination Report, with translation thereof, for corresponding Appl No. 10 2016 209 359.2, dated Jan. 27, 2017.
Translation of International Search report for corresponding PCT Appl No. PCT/EP2017/062639, dated Aug. 21, 2017.

* cited by examiner

EUV COLLECTOR

CROSS-REFERENCE TO RELATED APPLICATIONS

The present application is a continuation of, and claims benefit under 35 USC 120 to, international application PCT/EP2017/062639, filed May 24, 2017, which claims benefit under 35 USC 119 of German Application No. 10 2016 209 359.2, filed May 31, 2016. The entire disclosures of these applications are incorporated by reference herein.

FIELD

The disclosure relates to an EUV collector for use in an EUV projection exposure apparatus.

BACKGROUND

An illumination optical unit with an EUV collector for use in an EUV projection exposure apparatus is known from DE 10 2013 002 064 A1.

SUMMARY

The present disclosure seeks to develop an EUV collector of the type set forth at the outset in such a way that local reflectivity differences, in particular produced by defects and contaminations on the collector, do not have an unwanted effect on a far-field intensity distribution of the used EUV light, which is guided over the collector.

According to the disclosure, an EUV collector for use in an EUV projection exposure apparatus includes at least one mirror surface, which has surface structures for scattering a used EUV wavelength ($\lambda$) of used EUV light. The mirror surface has a surface height with a spatial wavelength distribution between a lower limit spatial wavelength and an upper limit spatial wavelength. The lower limit spatial wavelength lies in the range between 1 μm and 100 μm. The upper limit spatial wavelength is at least ten times as large as the lower limit spatial wavelength. An effective roughness (rmsG) below the lower limit spatial wavelength satisfies the following relation:

$$(4\pi \text{ rmsG } \cos(\theta)/\lambda)^2 < 0.1,$$

where $\theta$ denotes an angle of incidence of the used EUV light at the mirror surface. The following applies to an effective roughness (rmsGG') between the lower limit spatial wavelength and the upper limit spatial wavelength:

$$1.5 \text{ rmsG} < \text{rmsGG'} < 6 \text{ rmsG}.$$

The EUV collector can be a first component, which guides used EUV light, in the beam path after a source region of an EUV light source. The far-field intensity distribution is present in a far field of the collector, in which a subsequent component, which guides the used EUV light, of the projection exposure apparatus is arrangeable. The far-field plane can be an image plane that is conjugate to the collector. The mirror surface of the EUV collector serves to reflect the used EUV light. On account of scattering at the surface structures of the mirror surface, deviations from an ideal reflection, in particular deviations from a specular reflection, occur. The collector can be at least one surface portion of an ellipsoid, a hyperboloid, a paraboloid or a sphere. A multi-part collector is also possible.

The EUV collector is distinguished by reflecting light having a certain used wavelength (used EUV light). The EUV collector can bring together the used EUV light on at least one intermediate focus. A source module containing the collector can be separated from the remaining optical system by way of an aperture that has dimensions of only a few millimeters (the so-called intermediate focus aperture). For a punctiform light source, the collector can be designed in such a way that a punctiform image arises in the intermediate focus plane. An extended light source leads to a broadening of the light distribution in a possibly present intermediate focus plane. For manufacturing reasons, a real collector may have surface roughness, which leads to the scattering of the light and hence to further broadening of the image. Here, scattering angles that are too large have as a consequence that light is guided outside of the intermediate focus aperture and is consequently no longer available as used light. A loss of transmission resulting herefrom is unwanted. A scattering angle distribution introduced by the spatial wavelength distribution or roughness leads to a local homogenization of the intensity distribution in the far field.

The scattering angle distribution of the collector surface can be designed in such a way that the light losses at the intermediate focus aperture are minimized and light is merely redistributed within this aperture in order to use the desired homogenization effect in the far field.

The component of the light scattered in a certain angle range is related to the effective roughness in a corresponding spatial wavelength range of the surface structures on the collector surface. The scattering angle distribution introduced by the surface is influenced by the roughness being predetermined in a manner dependent on the spatial wavelength of the surface structures.

The roughness below a certain spatial wavelength leads to losses at the intermediate focus aperture. Below this lower limit spatial wavelength, the effective roughness should satisfy a condition which is described as Rayleigh smooth-surface criterion in the textbook "Optical Scattering: Measurement and Analysis" by John C. Stover, SPIE, 2nd edition 1995 (see, in particular, formula (3.46) therein).

Unwanted effects of surface structures due to manufacturing, for example of edges of a grating for suppressing unwanted wavelengths, also can be reduced or avoided by an appropriate predetermination of the spatial wavelength distribution. The spatial wavelength distribution can be present at a substrate surface of the EUV collector. As an alternative or in addition thereto, the spatial wavelength distribution also can be present below a reflecting surface and, in particular, below a reflecting multi-ply layer of the EUV collector.

Between the lower limit spatial wavelength and the upper limit spatial wavelength, the effective roughness is increased in relation to the Rayleigh smooth-surface criterion in a targeted manner by at least a factor of 1.5, but by less than a factor of 6. The surface structures with the specific surface roughness with an increased effective roughness above a limit spatial wavelength bring about a scattering effect of the mirror surface that, on the one hand, is so large that unwanted intensity smearing in the far field of the collector occurs and, on the other hand, is so small that this does not result in unwanted used-light losses along the used light beam path after the EUV collector. In particular, produced scattering angles can be so small that, to the extent that the EUV collector transmits the used light to an intermediate focus, an intermediate focus stop is also passed by the scattered light without unwanted losses. In comparison with the specific roughness present below the lower limit spatial wavelength, the effective roughness between the lower and the upper limit spatial wavelength can be increased by at least a factor of 1.75, by at least a factor of 2, by at least a factor of 2.5, by at least a factor of 3, by at least a factor of 3.5, by at least a factor of 4, by at least a factor of 4.5, by at least a factor of 5 or else by at least a factor of 5.5. As an alternative or in addition thereto, the effective roughness between the lower and the upper limit spatial wavelength in comparison with the effective roughness below the lower limit spatial wavelength can be increased by less than a factor of 5.5, by less than a factor of 5, by less than a factor of 4.5, by less than a factor of 4, by less than a factor of 3.5, by less than a factor of 3, by less than a factor of 2.5 or else by less than a factor of 2.

The scattering mirror surface of the EUV collector can be an NI (normal incidence) mirror surface with angles of incidence θ less than 45° or a GI (grazing incidence) mirror surface with angles of incidence θ greater than 45°. The EUV collector may have a plurality of mirror surfaces which have corresponding surface structures for scattering the used EUV wavelength. These mirror surfaces can all be constructed as NI mirror surfaces, can all be constructed as GI mirror surfaces or can be constructed from NI and GI mirror surfaces in mixed fashion. An NI angle of incidence θ can be significantly less than 45°, can be less than 35°, can be less than 30°, can be less than 25°, can be less than 20° and can also be even smaller. A GI angle of incidence θ can be significantly greater than 45°, can be greater than 55°, can be greater than 60°, can be greater than 65°, can be greater than 70°, can be greater than 75°, can be greater than 80°, can be greater than 85° and can also be even larger.

Scattering optical components in a projection exposure apparatus are known from EP 1 796 147 A1, DE 10 2012 209 882 A1 and WO 2013/174644 A1.

The limit spatial wavelength can be greater than 5 µm. Such a limit spatial wavelength has proven its worth in practice.

The collector can have a mirror center, wherein the spatial wavelength distribution is such that a mirror surface element has a radial scattering angle distribution in relation to the mirror center that deviates from an azimuthal scattering angle distribution in relation to the mirror center. Such a scattering angle distribution can be adapted to desired scattering properties that arise on account of the design of the optical components and/or on account of the beam guidance of the used EUV light. In particular, it is possible to compensate or correct production-specific scattering functions of the optical components by the anisotropic scattering angle distribution brought about in a targeted manner. Production-specific or design-related intensity modulations, for example at edges of an applied (super-) grating for filtering wavelengths that deviate from the used EUV wavelength also can be compensated or corrected by a corresponding anisotropic scattering angle distribution.

The radial scattering angle distribution can cover a greater scattering angle range than the azimuthal scattering angle distribution. Alternatively, the azimuthal scattering angle distribution can cover a greater scattering angle range than the radial scattering angle distribution.

At least one portion of the mirror surface can have a grating structure for diffracting extraneous light, the wavelength of which deviates from the used EUV wavelength. Such an additional grating structure renders it possible to suppress extraneous light by diffraction.

The disclosure provides a method for producing an EUV collector as described herein. The method includes providing a raw collector substrate, which has an initial roughness over all spatial wavelengths, and processing a surface of the raw collector substrate such that an effective roughness (rmsG) is reduced only below the limit spatial wavelength by more than a factor of 1.5. Advantages of such a production method correspond to those that described above with reference to the collector according to the disclosure. When processing the surface, a targeted increase in the effective roughness can additionally be brought about between the lower limit spatial wavelength and the upper limit spatial wavelength or, alternatively, above the lower limit spatial wavelength in general, i.e., additional surface structures can be introduced or additional surface roughness can be produced in the region of these spatial wavelengths in a targeted manner. Alternatively, it is possible to produce no such targeted increase in the effective roughness in comparison with the initial roughness present in any case.

The surface treatment of the raw collector substrate can be implemented by polishing. As an alternative or in addition thereto, ion beam figuring (IBF), sandblasting, diamond turning, fly cutting, spin coating, coating, etching, molding or else applying a fluid, in particular a smoothing fluid, with admixed particles of a defined size can be implemented for treating the surface of the raw collector substrate. In this last surface treatment variant by applying a fluid, a light scattering behavior can be determined by way of a size and/or by way of distribution of the particles.

The surface of the raw collector substrate processed within the scope of the production method is the surface that determines the scattering properties of the light. Here, this can be a multi-ply layer, for example a MoSi multi-ply layer. As an alternative and particularly when using a grazing incidence collector mirror, the surface of the raw collector substrate to be processed can be a Ru layer. The roughness of such a layer can be influenced directly by a processing method, or else it can be influenced by processing of an adjacent interface which, for example, lies lower down. As an alternative or in addition thereto, further layers, which introduce practically no phase offsets for the used light, can be applied above the reflecting layer or the reflecting layers. A roughness of such further layers regularly plays no role. Processing a surface of the raw collector substrate is also understood to mean the raw collector substrate initially being coated with at least one layer, with the at least one applied layer then being processed.

The disclosure provides an illumination system that includes an EUV collector as described herein, and an illumination optical unit for guiding the illumination light from the EUV collector toward an object field in an object plane, in which an object to be imaged is arrangeable. The advantages of such an illumination system correspond to those above with reference to the EUV collector and the production method thereof.

The EUV collector can be arranged in near-field fashion in relation to a field plane that is conjugate to the object plane. The advantages mentioned at the outset are brought to bear particularly well in such a case. For the purposes of characterizing the term "near-field", use can be made of a parameter P, which is defined in conjunction with WO 2009/024164 A.

The disclosure provides a projection optical unit for imaging the object field into an image field in which a substrate is arrangeable, a projection exposure apparatus including an illumination system disclosed herein and an EUV light source, a method of using such a projection exposure apparatus to produce a structured component, and a structured component made by such a method. The advantages of such aspects correspond to those which explained above with reference to the EUV collector, the production method thereof and the illumination system.

In particular, a semiconductor component, for example a memory chip, may be produced using the projection exposure apparatus.

BRIEF DESCRIPTION OF THE DRAWINGS

Exemplary embodiments of the disclosure are explained in greater detail below with reference to the drawings, in which.

DESCRIPTION OF EXEMPLARY EMBODIMENTS

Figure 1:
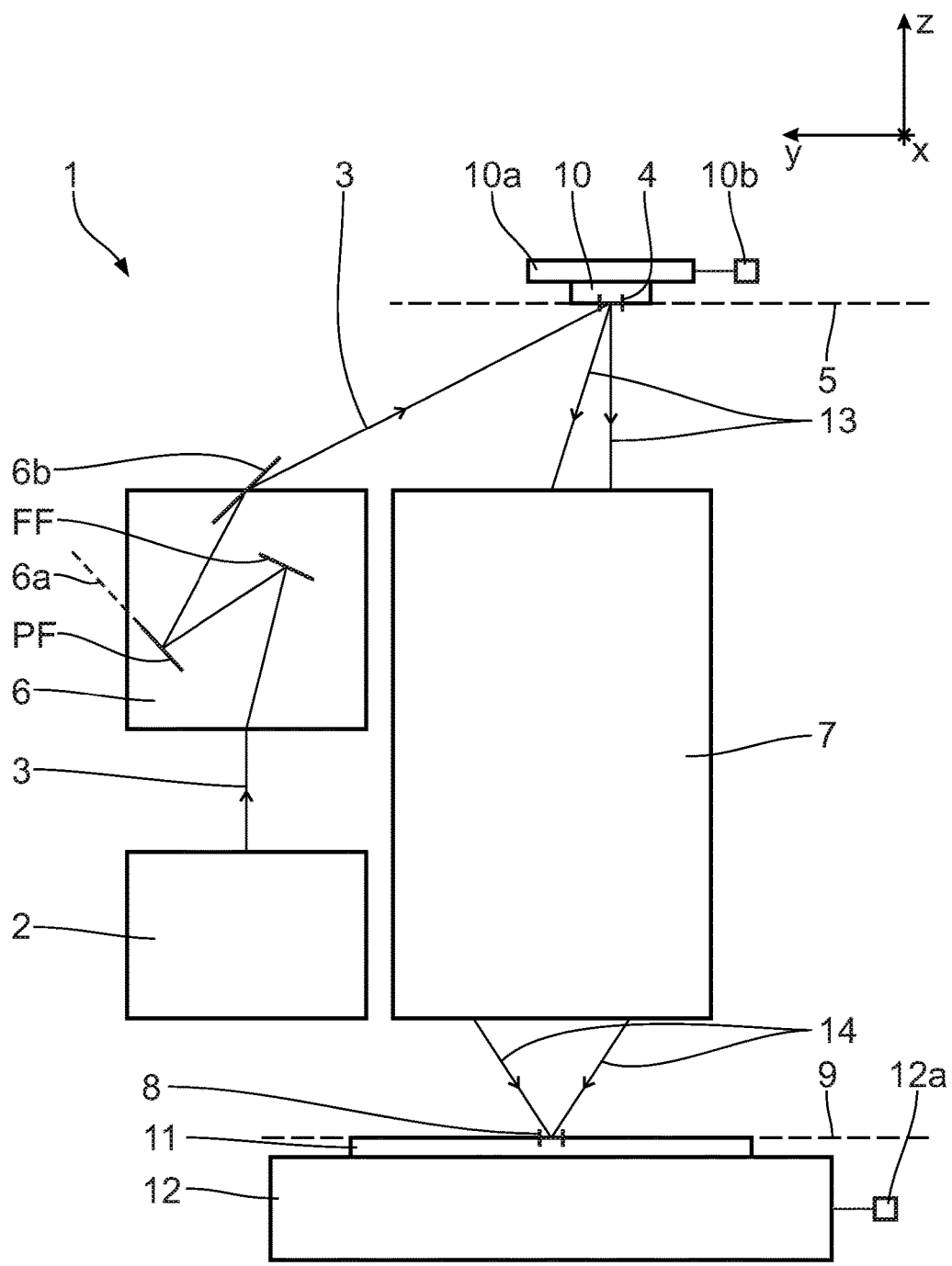
FIG. 1 schematically shows a projection exposure apparatus for EUV microlithography.

A projection exposure apparatus 1 for microlithography comprises a light source 2 for illumination light and/or imaging light 3, which will be explained in yet more detail below. The light source 2 is an EUV light source, which produces light in a wavelength range of e.g. between 5 nm and 30 nm, in particular between 5 nm and 15 nm. The illumination light and/or imaging light 3 is also referred to as used EUV light below.

In particular, the light source 2 may be a light source with a used EUV wavelength of 13.5 nm or a light source with a used EUV wavelength of 6.9 nm or 7 nm. Other used EUV wavelengths are also possible. A beam path of the illumination light 3 is depicted very schematically in FIG. 1.

An illumination optical unit 6 serves to guide the illumination light 3 from the light source 2 to an object field 4 in an object plane 5. The illumination optical unit comprises a field facet mirror FF depicted very schematically in FIG. 1 and a pupil facet mirror PF disposed downstream in the beam path of the illumination light 3 and likewise depicted very schematically. A field-forming mirror 6b for grazing incidence (GI mirror; grazing incidence mirror) is arranged in the beam path of the illumination light 3 between the pupil facet mirror PF, which is arranged in a pupil plane 6a of the illumination optical unit, and the object field 4. Such a GI mirror 6b is not mandatory.

Pupil facets (not depicted in any more detail) of the pupil facet mirror PF are part of a transfer optical unit, which transfer, and in particular image, field facets (likewise not depicted) of the field facet mirror FF into the object field 4 in a manner superposed on one another. An embodiment known from the prior art may be used for the field facet mirror FF on the one hand and the pupil facet mirror PF on the other hand. By way of example, such an illumination optical unit is known from DE 10 2009 045 096 A1.

Using a projection optical unit or imaging optical unit 7, the object field 4 is imaged into an image field 8 in an image plane 9 with a predetermined reduction scale. Projection optical units which may be used to this end are known from e.g. DE 10 2012 202 675 A1.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction extends to the left in FIG. 1 and the z-direction extends upward in FIG. 1. The object plane 5 extends parallel to the xy-plane.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

One of the exemplary embodiments known from the prior art may be used for the projection optical unit 7. What is imaged in this case as an object is a portion of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

Figure 2:
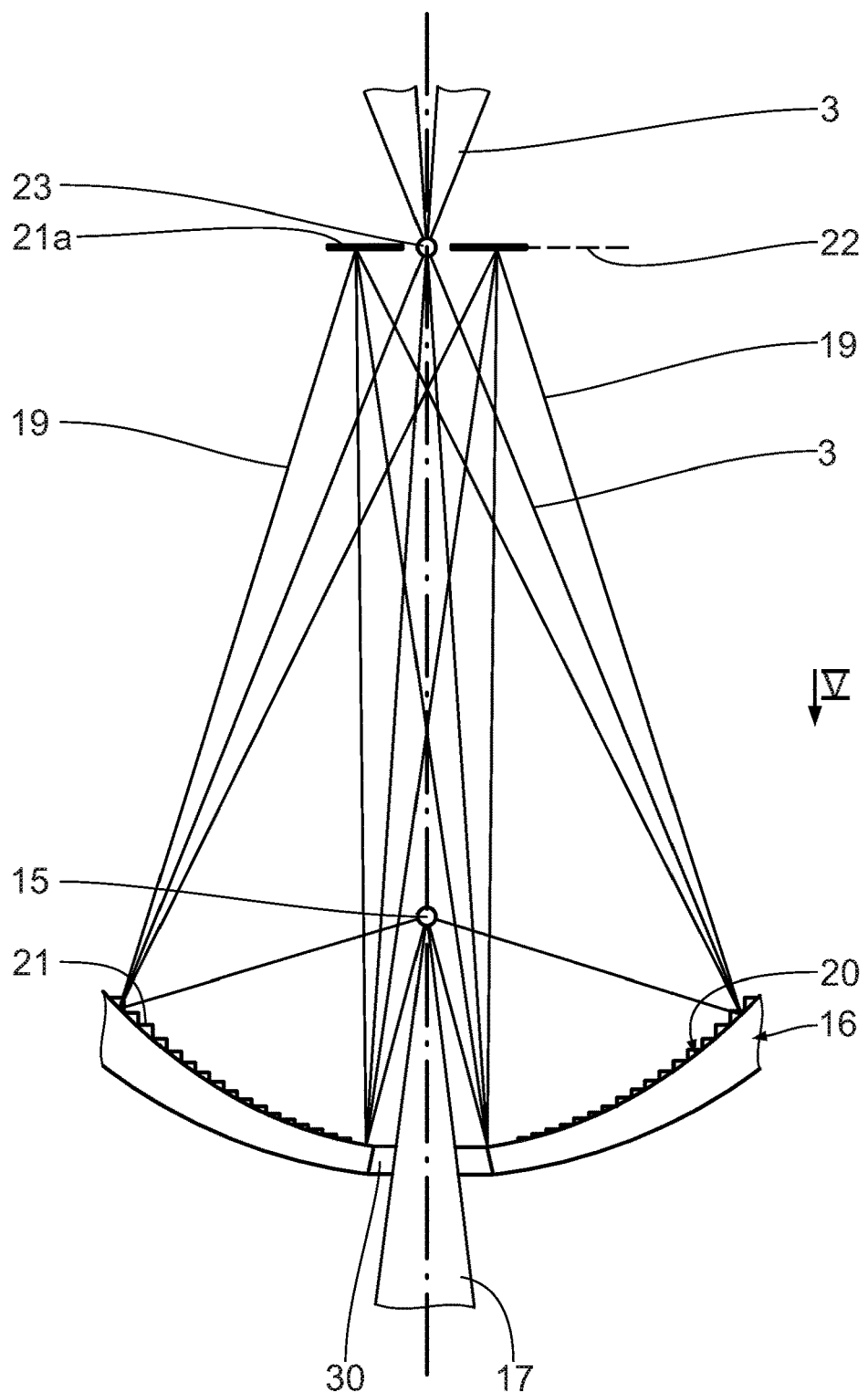
FIG. 2 shows, in a meridional section, a light path to and from a plasma source region of an EUV light source of the projection exposure apparatus according to FIG. 1, wherein, in particular, a diffracting, extraneous-light-suppressing effect of an EUV collector mirror is illustrated, the EUV collector mirror representing a first, used-EUV-light-guiding component after the EUV source region.

FIG. 2 shows a beam path to and from a source region 15 of the EUV light source 2 and shows, in particular, an extraneous-light-suppressing effect of an EUV collector 16.

Pump light 17, for example the emission of a CO2 laser, is focused in the source region 15 and interacts with a target medium not illustrated in any more detail, the target medium emitting, firstly, used EUV light 3 with a used EUV wavelength, e.g. 6.9 nm or 13 nm, and extraneous light 19 with a wavelength deviating from the used EUV wavelength.

Both the used EUV light 3 and the extraneous light 19 are reflected by a mirror surface 20 of the EUV collector 16.

The mirror surface 20 has a grating structure 21, which is not illustrated true to scale in FIG. 2. The grating structure 21 serves to deflect the extraneous light 19 by diffraction such that only the used EUV light 3 passes an intermediate focus stop 21a, which is arranged in an intermediate focus plane 22. The intermediate focus plane 22 represents an image plane of the source region 15. Accordingly, the mirror surface 20 of the EUV collector 16 is embodied with the basic form of a conic section surface. In the embodiment illustrated in FIG. 2, the mirror surface 20 is embodied with the basic form of an ellipsoid surface, the source region 15 being arranged in the one focus of the mirror surface and an intermediate focus 23 in the intermediate focus plane 22 lying in the other focus of the mirror surface.

Figure 4:
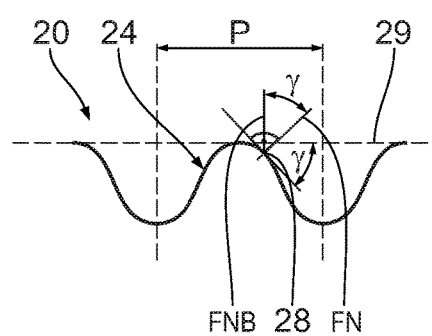
FIG. 4 shows a surface structure of a mirror surface of the EUV collector very schematically for the purposes of elucidating a spatial wavelength and a gradient angle.

In addition to the grating structure 21, the mirror surface 20 has surface structures 24, which are illustrated very schematically in FIG. 4. The surface structures can be described as variations of the surface height or surface roughness of the mirror surface 20. The surface structures 24 serve to scatter the used EUV wavelength of the used light 3. On account of these surface structures 24, the mirror surface 20 has a surface roughness. This surface roughness yields the surface structure distribution depending on spatial wavelengths P (see FIG. 4, for example) above a limit spatial wavelength PG (see FIG. 9, for example). Surface structures with spatial wavelengths below the limit spatial wavelength PG are greatly reduced by an appropriate surface treatment, in particular by smoothing or polishing, and so the following applies to an effective roughness rmsG for spatial wavelengths P below the limit spatial wavelength PG:

$(4\pi \text{ rmsG } \cos(\theta)/\lambda)^2 < 0.1$

Here, $\lambda$, is the used EUV wavelength. Here, $\theta$ is the angle of incidence of the used EUV light 3 at the mirror surface 20.

Apart from the angle of incidence $\theta$, the relation for the effective roughness rmsG depends only on the used light wavelength $\lambda$. For $\lambda=13.5$ nm and $\theta=0$, the following applies: rmsG$\leq$0.35 nm.

The effective roughness rms emerges as an integral of a range between two different limit spatial wavelengths. An effective roughness rmsGG' of the mirror surface 20 above the lower limit spatial wavelength PG and below the upper limit spatial wavelength PG', i.e., between the lower and the upper limit spatial wavelength, is at least one and a half times as large, but no more than six times as large, as below the lower spatial wavelength PG.

An effective roughness rmsGG', which lies in the region of 0.53 nm, with 0.53 nm representing a lower limit for this effective roughness, can be present in the region of the lower limit spatial wavelength PG. An effective roughness rmsGG', which lies in the region of 2.1 nm, with 2.1 nm representing the upper limit of this effective roughness, can be present in the region of the upper limit spatial wavelength PG'.

Polishing the mirror surface 20 at spatial wavelengths below the limit spatial wavelength PG can be such that these spatial wavelengths practically do not contribute to a spectral power density (PSD).

Figure 9:
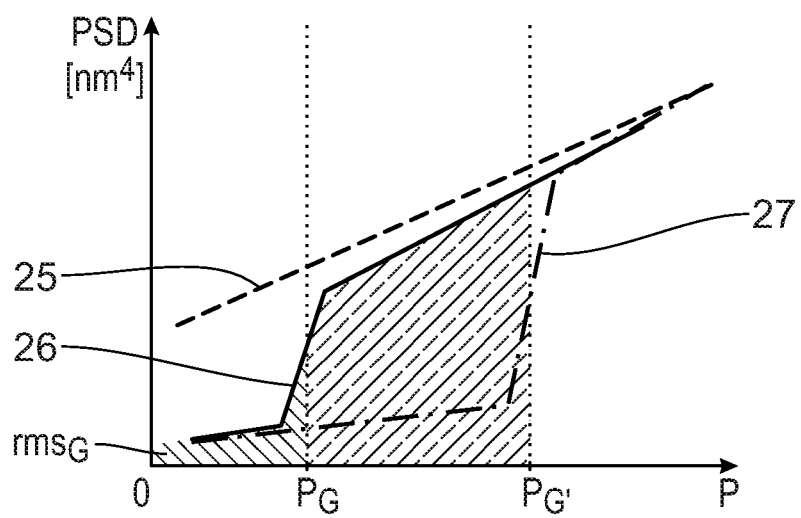
FIG. 9 shows the dependence of a spectral power density on a spatial wavelength within the scope of a production method for an EUV collector.

The spectral power density PSD is specified in units of [nm4] in FIG. 9. Details regarding the definition of the spectral power density are found in the textbook "Optical Scattering: Measurement and Analysis" by John C. Stover, SPIE, 2nd edition 1995 and 3rd edition 2012, and in the article "Power Spectral Density (PSD)" on the Internet pages of www.nanophys.kth.se.

A measurement method for, firstly, the spectral power density PSD and, secondly, the effective roughness rms can be gathered from the article "Surface characterization techniques for determining the root-mean-square roughness and power spectral densities of optical components" by Duparré et al., Applied Optics, volume 41, number 1, Jan. 1, 2002. Various measurement appliances are discussed in the section "3. Instruments" in this article. The section "4. Calculation of the Power Spectral Density Function and the rms roughness" of this article specifies how, firstly, the spectral power density PSD and, secondly, the effective roughness rms, referred to there as arms, are calculated from the obtained measurement data.

In FIG. 9, there is logarithmic scaling both in relation to the PSD and in relation to the spatial wavelength. The respective rms values for the effective roughness emerge from the PSD representation according to FIG. 9 on the basis of the following relationship:

$\text{rms}^2 = 2 \cdot \int_{f_1}^{f_2} 2\pi f \cdot PSD(f) \cdot df$

The effective roughness rmsG below the lower limit spatial wavelength PG emerges from this relationship by choosing the following integration limits: f1=1/PG and f2=1/$\lambda$EUV. Here, $\lambda$EUV is the used EUV wavelength. In FIG. 9, rmsG is reproduced by an area that is hatched using solid lines. The effective roughness rmsGG' between the lower limit spatial wavelength PG and the upper limit spatial wavelength PG' emerges from the relationship above by inserting the limits f1=1/PG' and f2=1/PG. In FIG. 9, rmsGG' is reproduced by an area this is hatched using solid and dashed lines in alternation.

FIG. 9 shows how such a spatial wavelength distribution is produced on the mirror surface 20 of the EUV collector 16. First, a raw collector substrate is provided, the raw collector substrate having an initial roughness 25, illustrated using dashed lines in FIG. 9, over all spatial wavelengths. Subsequently, a surface of the raw collector substrate is processed, i.e., the latter is polished, for example, such that the effective roughness rms below the limit spatial wavelength PG only is reduced by more than a factor of 2 in comparison with the initial roughness 25. The result is a target roughness 26, which is illustrated in FIG. 9 as a solid line. There is no polishing, or at best little polishing, of surface structures of the initial roughness 25 above the limit spatial wavelength PG, and so these surface structures are maintained, at least to the greatest part.

This production method differs from typical mirror polishing, in which the initial roughness 25 is removed by polishing down to a limit spatial frequency PG'. The result of this typical mirror polishing is illustrated in FIG. 9 by a dash-dotted curve 27 (typical roughness). The limit spatial wavelength PG' of the typical roughness 27 can be greater than 10 µm and, in particular, can be greater than 50 µm. By way of example, the upper limit spatial wavelength PG' can lie in the region of 100 µm.

The limit spatial wavelength PG in the case of the target roughness 26 lies in the range between 1 µm and 100 µm. This limit spatial wavelength PG can be greater than 2 µm, can be greater than 5 µm, can lie in the region of 6 µm, can be greater than 8 µm, can be greater than 10 µm, can be greater than 15 µm, can be greater than 20 µm and can be greater than 50 µm. The limit spatial wavelength PG can be less than 90 µm, can be less than 80 µm, can be less than 70 µm, can can be less than 50 µm, can be less than 20 µm and can be less than 10 µm.

Figure 3:
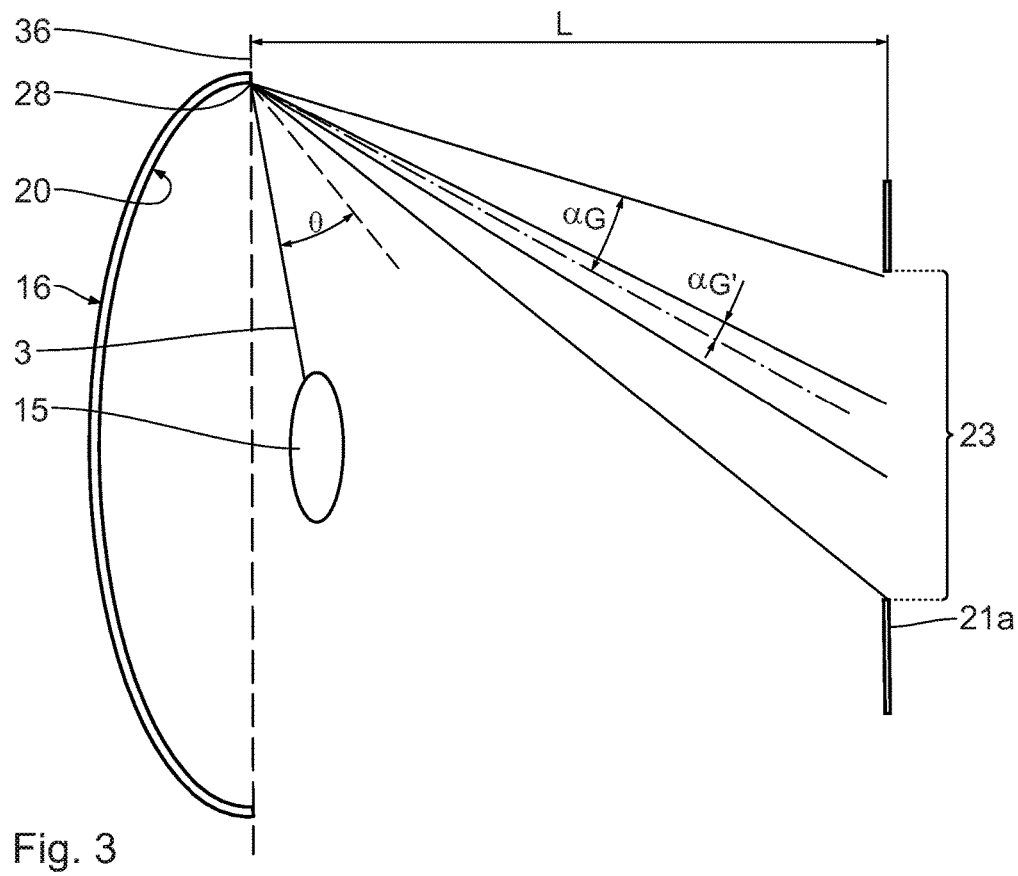
FIG. 3 shows the EUV collector more schematically compared to FIG. 2, wherein a scattering effect of a mirror surface element of the EUV collector for the used EUV light is illustrated with an exaggerated scattering angle up to an intermediate focus of the beam path of the used EUV light.

FIGS. 3 and 4 show typical quantities, with the aid of which the spatial wavelength P can be estimated. In FIG. 3, L denotes a distance between a respective scattering mirror surface element 28 and the intermediate focus 23. A maximum permissible diameter of the intermediate focus 23 is denoted by dIF, the diameter corresponding to an aperture of the intermediate focus stop 21a. In FIG. 3, a denotes a typical scattering angle of the mirror surface element 28. This scattering angle α is illustrated in exaggerated fashion in FIG. 3. In FIG. 4, 29 denotes a conic section surface, to which the mirror surface 20 with the mirror surface element 28 is fitted best. The conic section surface 29 is describable by a rotationally symmetric function. FN denotes a normal to the mirror surface element 28. FNB denotes a normal to the conic section surface 29. A gradient angle γ is present between these two normals FN and FNB.

The following relationships apply:

$$\sin(\alpha) = \lambda/(P \cos \theta)$$

Here, α is the scattering angle, λ, is the used EUV wavelength and P is the spatial wavelength of the surface structure. θ is the angle of incidence of the illumination light 3 at the mirror element 28.

Furthermore, the following applies:

$$\sin(\alpha G) \approx dIF/2\ L$$

Here, αG or αmax is the maximum permissible scattering angle, dIF is the permissible diameter of the intermediate focus 23 (=aperture width of the intermediate focus stop 21a) and L is the distance between the mirror surface element 28 and the intermediate focus 23. The aforementioned relationship for αG applies approximately to dIF/L<1.

These formulae are exemplary for a scattering direction in a plane that is defined by a direction of the incident beam and a normal at the surface of the collector, i.e., of the mirror surface element 28, in particular. Adapted formulae apply to the scattering from this plane and reference is made in this respect to the textbook "Optical Scattering: Measurement and Analysis" by John C. Stover, SPIE, 2nd edition 1995 and 3rd edition 2012.

By eliminating the scattering angle α, the following emerges from the two formulae above:

$$PG \approx (2\ L/dIF)\lambda 1/\cos \theta$$

for the lower limit spatial wavelength PG. The upper limit spatial wavelength PG' is at least ten times as large as the lower limit spatial wavelength PG and can be, e.g., fifteen times as large. Accordingly, the scattering angle αG at the lower limit spatial wavelength PG is approximately fifteen times as large as the scattering angle αG' at the upper limit spatial wavelength PG'. The formula specified above applies approximately for small scattering angles α.

Figure 5:
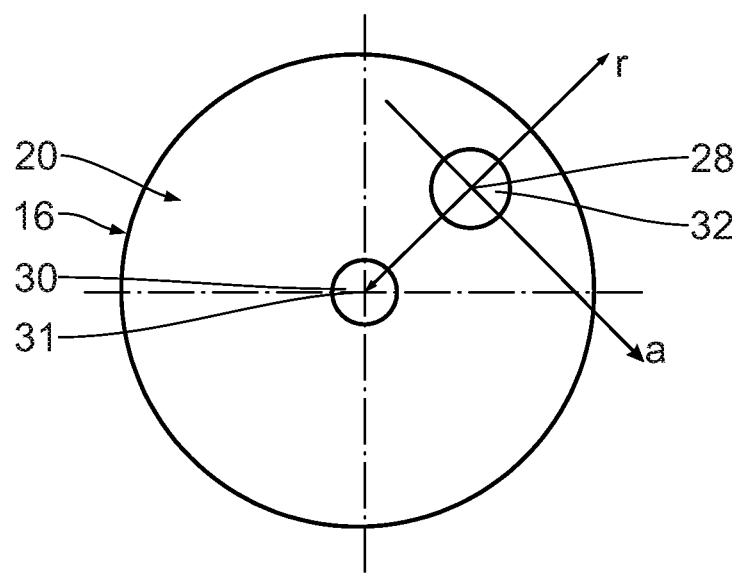
FIG. 5 schematically shows the collector from the viewing direction V in FIG. 2, wherein a 2D scattering angle distribution for a mirror surface element is illustrated, the 2D scattering angle distribution being just as large in the radial direction as in the azimuthal direction.
Figure 6:
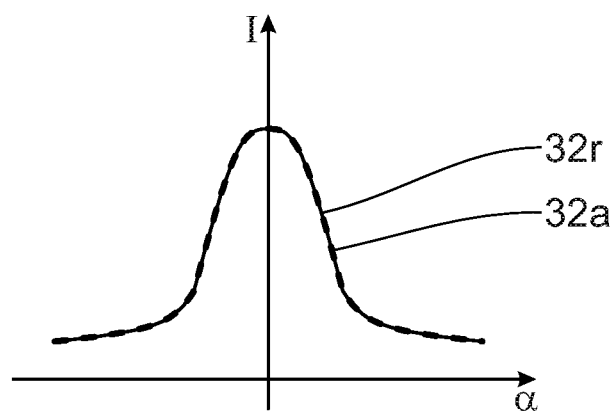
FIG. 6 shows a diagram of the dependence of a scattering intensity on a scattering angle in the scattering angle distribution according to FIG. 5.

As illustrated in FIG. 2, the pump light 17 passes through a passage opening 30 in the region of a mirror center 31 of the mirror surface 20 of the EUV collector 16 (see also FIGS. 5 and 6). The pump light can also be radiated in differently, for example by way of a further deflection mirror from a direction perpendicular to the plane of the drawing of FIG. 2.

FIG. 5 elucidates a 2D scattering angle distribution 32 of a mirror surface element 28. This scattering angle distribution is just as large in the radial direction r as in the azimuthal direction a. In particular, the scattering angle 32 according to FIG. 5 is isotropic.

This isotropy of the 2D scattering angle distribution 32 is likewise illustrated in FIG. 6, which illustrates the dependence of a scattering intensity I on the scattering angle α. This dependence is just as large for the radial direction r (solid line in FIG. 6; scattering angle distribution 32r) as for the azimuthal direction a (dashed line in FIG. 6; scattering angle distribution 32a).

Figure 7:
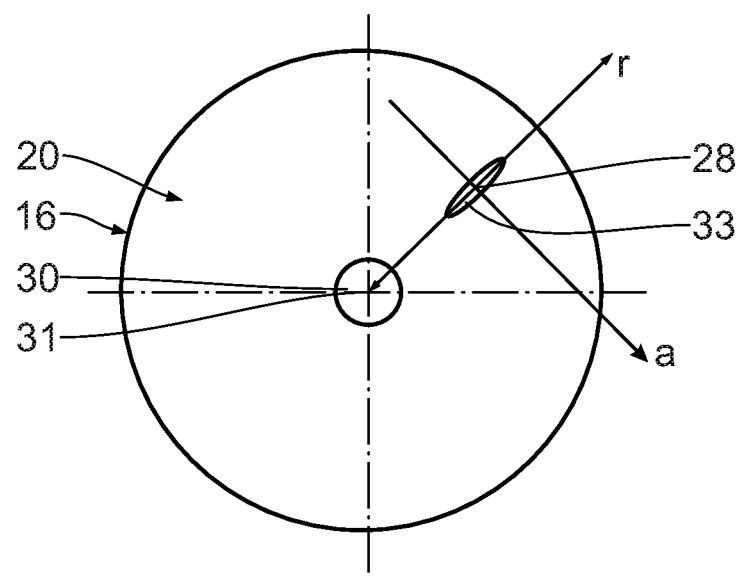
FIG. 7 shows, in an illustration similar to FIG. 5, a further embodiment of a 2D scattering angle distribution of a mirror surface element, wherein a radial scattering angle distribution deviates from an azimuthal scattering angle distribution.
Figure 8:
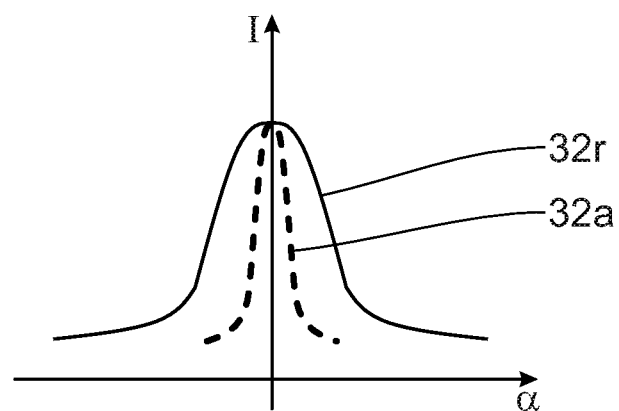
FIG. 8 shows, in a diagram similar to FIG. 6, the dependence of the intensity on the scattering angle in the scattering angle distribution according to FIG. 7.

FIGS. 7 and 8 are used to explain an alternative 2D scattering angle distribution 33 of the mirror surface element 28. This scattering angle distribution 33 is anisotropic and many times greater in the radial direction r than in the azimuthal direction a. Accordingly, a width of a distribution of the scattering intensity I over the scattering angle α is many times greater in the scattering angle distribution 33 in the radial direction r (solid line in FIG. 8; scattering angle distribution 32r) than in the azimuthal direction a (dashed line in FIG. 8; scattering angle distribution 32a). The following can apply to a ratio of the widths FWHM (full width at half maximum) of the I(α) curves 32r and 32a: FWHM (Ir(α))/FWHM (Ia(α))≥2. This ratio can also be greater than 3, can be greater than 4 and can be even greater still.

With the aid of the anisotropic 2D scattering angle distribution 33, it is possible, for example, to smooth rotationally symmetric defects, which may arise from the production method of the mirror surface 20.

Figure 10:
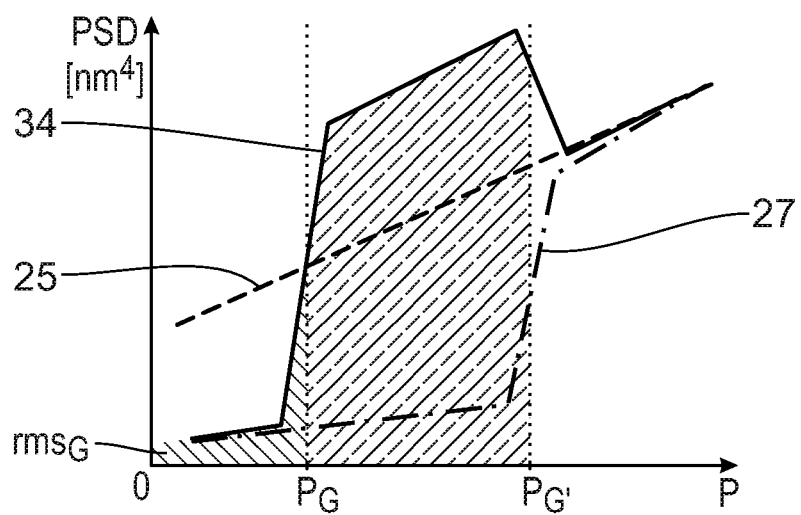
FIGS. 10 and 11 show further embodiments of a dependence of the spectral power density on a spatial wavelength for further variants of a production method for an EUV collector.
Figure 11:
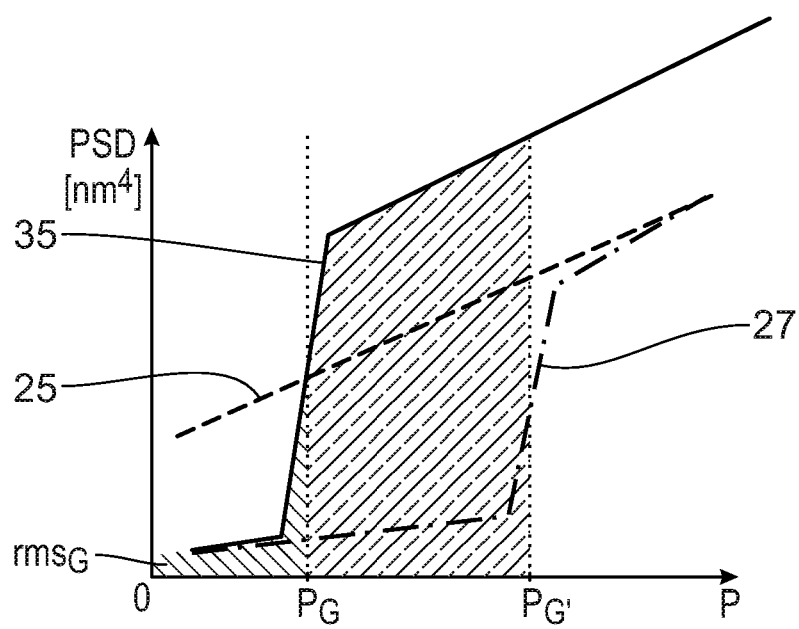

Two further embodiments of a method for producing the mirror surface 20 of the EUV collector 16 are presented on the basis of FIGS. 10 and 11. Components, functions and variables corresponding to those that were already explained above with reference to the production method according to FIG. 9 are denoted by the same reference signs and not discussed in detail again.

In the production method according to FIG. 10, additional surface roughness in comparison with the initial roughness 25 is produced in targeted fashion between the limit spatial wavelengths PG and PG' such that a target roughness 34 in the range between the limit spatial wavelengths PG and PG' is significantly larger than the initial roughness 25. What may hold true for the effective roughness rms is that the latter, in comparison with the initial roughness 25, is greater by more than 10%, more than 20%, more than 30% or else more than 50% in the range between the limit spatial wavelengths PG and PG'.

The target roughness 34 merges back into the initial roughness 25 above the limit spatial wavelength PG' of the typical mirror production method.

In the production method according to FIG. 11, a target roughness 35 is produced, the target roughness being greater overall than the initial roughness 25 above the limit spatial wavelength PG, i.e., this also holds true above the limit spatial wavelength PG' of the typical mirror production method.

In relation to a field plane that is conjugate to the object plane 5 and that can lie at the location of the plane 36 in FIG. 3, for example, the EUV collector 16 is arranged in near-field fashion.

A parameter P is used to characterize the "near-field" positioning of the collector 16 in relation to the field plane 36, the following applying to the parameter:

$$P(M)=D(SA)/(D(SA)+D(CR))$$

Here:

D(SA) is the diameter of a sub-aperture, i.e., the illumination light rays belonging to precisely one field point, on the mirror surface of the collector 16;

D(CR) is a maximum spacing of chief rays, which emanate from the field plane, on the mirror surface of the collector 16.

This definition of the parameter P is found in WO 2009/024164 A, for example.

Provided that the collector 16 is arranged exactly in the field plane 36, P=0 applies, since D(CR) is unequal to zero and D(SA) equals zero in that case. Should the collector 16 be arranged in a pupil plane, P=1 would apply, since D(CR) equals zero and D(SA) is unequal to zero in that case.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An EUV collector, comprising:
a mirror surface which comprises surface structures configured to scatter a wavelength ($\lambda$) of EUV light,
wherein:
the mirror surface has a surface height with a spatial wavelength distribution between a lower limit spatial wavelength and an upper limit spatial wavelength;
the lower limit spatial wavelength lies in the range between 1 μm and 100 μm;
the upper limit spatial wavelength is at least ten times larger than the lower limit spatial wavelength;
an effective roughness (rmsG) below the lower limit spatial wavelength satisfies the following relation:

$$(4\pi \, rmsG \, cos(\theta)/\lambda)^2 < 0.1;$$

where $\theta$ denotes an angle of incidence of the EUV light at the mirror surface;
the following applies to an effective roughness (rmsGG') between the lower limit spatial wavelength (PG) and the upper limit spatial wavelength (PG'):

$$1.5 \, rmsG < rmsGG' < 6 \, rmsG;$$

the collector has a mirror center; and
the spatial wavelength distribution is such that a mirror surface element has a radial scattering angle distribution in relation to the mirror center that deviates from an azimuthal scattering angle distribution in relation to the mirror center.

2. The EUV collector of claim 1, wherein the lower limit spatial wavelength is greater than 5 μm.

3. The EUV collector of claim 1, wherein the radial scattering angle distribution covers a greater scattering angle range than the azimuthal scattering angle distribution.

4. The EUV collector of claim 1, wherein the azimuthal scattering angle distribution covers a greater scattering angle range than the radial scattering angle distribution.

5. The EUV collector of claim 1, wherein a portion of the mirror surface comprises a grating structure configured to diffract extraneous light having a wavelength that deviates from $\lambda$.

6. A method, comprising:
providing an EUV collector according to claim 1 by a method that comprises:
providing a raw collector substrate having an initial roughness over all spatial wavelengths; and
processing a surface of the raw collector substrate so that an effective roughness is reduced only below the lower limit spatial wavelength by more than a factor of 1.5.

7. The method of claim 6, wherein processing the surface of the raw collector comprises polishing the surface of the raw collector.

8. An illumination system, comprising:
an EUV collector according to claim 1; and
an illumination optical unit configured to guide EUV light from the EUV collector toward an object field in an object plane.

9. The illumination system of claim 8, wherein the EUV collector is arranged in a near-field fashion in relation to a field plane that is conjugate to the object plane.

10. The illumination system of claim 8, further comprising a projection optical unit configured to image the object field into an image field.

11. A projection exposure apparatus, comprising:
an EUV light source; and
an illumination system according to claim 1.

12. An EUV collector, comprising:
a mirror surface which comprises surface structures configured to scatter a wavelength ($\lambda$) of EUV light,
wherein:
the mirror surface has a surface height with a spatial wavelength distribution between a lower limit spatial wavelength (PG) and an upper limit spatial wavelength;
the lower limit spatial wavelength (PG) lies in the range between 1 μm and 100 μm;
the upper limit spatial wavelength is at least ten times larger the lower limit spatial wavelength (PG);
an effective roughness (rmsG) below the lower limit spatial wavelength (PG) satisfies the following relation:

$$(4\pi \, rmsG \, cos(\theta)/\lambda)^2 < 0.1;$$

where $\theta$ denotes an angle of incidence of the EUV light at the mirror surface;
the following applies to an effective roughness (rmsGG') between the lower limit spatial wavelength (PG) and the upper limit spatial wavelength (PG'):

$$1.5 \, rmsG < rmsGG' < 6 \, rmsG;$$

for the lower limit spatial wavelength (PG) of the spatial wavelength distribution the following relationship applies: $PG \approx (2 \, L/dIF)\lambda 1/cos \, \theta$;
where L is a distance between a mirror surface element carrying the surface structures and an intermediate focus into which a source region is transferred by the EUV collector during use; and
dIF denotes a permissible diameter of the intermediate focus.

13. The EUV collector of claim 12, wherein the collector has a mirror center, and the spatial wavelength distribution is such that a mirror surface element has a radial scattering angle distribution in relation to the mirror center that deviates from an azimuthal scattering angle distribution in relation to the mirror center.

14. A method, comprising:
providing an EUV collector according to claim 12 by a method that comprises:
providing a raw collector substrate having an initial roughness over all spatial wavelengths; and
processing a surface of the raw collector substrate so that an effective roughness is reduced only below the lower limit spatial wavelength by more than a factor of 1.5.

15. An illumination system, comprising:
an EUV collector according to claim 12; and
an illumination optical unit configured to guide EUV light from the EUV collector toward an object field in an object plane.

16. The illumination system of claim 15, wherein the EUV collector is arranged in a near-field fashion in relation to a field plane that is conjugate to the object plane.

17. The illumination system of claim 15, further comprising a projection optical unit configured to image the object field into an image field.

18. A projection exposure apparatus, comprising:
an EUV light source; and
an illumination system according to claim 12.

19. An illumination system, comprising:
an EUV collector comprising a mirror surface which comprises surface structures configured to scatter a wavelength ($\lambda$) of EUV light; and
an illumination optical unit configured to guide the EUV light from the EUV collector toward an object field in an object plane,
wherein:
the mirror surface has a surface height with a spatial wavelength distribution between a lower limit spatial wavelength and an upper limit spatial wavelength;
the lower limit spatial wavelength lies in the range between 1 µm and 100 µm;
the upper limit spatial wavelength is at least ten times larger than the lower limit spatial wavelength;
an effective roughness (rmsG) below the lower limit spatial wavelength satisfies the following relation:

$(4\pi\ \text{rmsG}\ \cos(\theta)/\lambda)^2 < 0.1;$ where $\theta$ denotes an angle of incidence of the EUV light at the mirror surface;
the following applies to an effective roughness (rmsGG') between the lower limit spatial wavelength (PG) and the upper limit spatial wavelength (PG'):

$1.5\ \text{rmsG} < \text{rmsGG}' < 6\ \text{rmsG};$ and the EUV collector is arranged in near-field fashion in relation to a field plane that is conjugate to the object plane.

20. The illumination system of claim 19, further comprising a projection optical unit configured to image the object field into an image field.

* * * * *

UNITED STATES PATENT AND TRADEMARK OFFICE
CERTIFICATE OF CORRECTION

Page 1 of 1

PATENT NO. : 10,503,075 B2
APPLICATION NO. : 16/199946
DATED : December 10, 2019
INVENTOR(S) : Ingrid Schuster et al.

It is certified that error appears in the above-identified patent and that said Letters Patent is hereby corrected as shown below:

In the Specification

Column 9, Line 20, delete "a" and insert -- α --, therefor.

Signed and Sealed this
Seventh Day of April, 2020

Andrei Iancu
*Director of the United States Patent and Trademark Office*